United States Patent
Tanaka

(10) Patent No.: US 8,383,481 B2
(45) Date of Patent: Feb. 26, 2013

(54) SEMICONDUCTOR MEMORY DEVICE AND METHOD OF MANUFACTURING THE SAME

(75) Inventor: Masayuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 13/104,815

(22) Filed: May 10, 2011

(65) Prior Publication Data

US 2012/0068246 A1    Mar. 22, 2012

(30) Foreign Application Priority Data

Sep. 21, 2010   (JP) .................................. 2010-211379

(51) Int. Cl.
H01L 21/336    (2006.01)
(52) U.S. Cl. . 438/264; 438/435; 257/321; 257/E21.202; 257/E29.02; 257/E27.103
(58) Field of Classification Search .................. 438/435, 438/266, 264; 257/321, E21.202, E21.179, 257/E21.661, E27.103, E29.202; 216/62
See application file for complete search history.

(56) References Cited

U.S. PATENT DOCUMENTS

| | | | | |
|---|---|---|---|---|
| 7,960,230 B2 * | 6/2011 | Ozawa | ........................... | 438/261 |
| 2006/0008999 A1 * | 1/2006 | Mohklesi | ...................... | 438/287 |
| 2007/0224760 A1 * | 9/2007 | Matsui et al. | .................. | 438/257 |
| 2009/0035905 A1 * | 2/2009 | Alapati et al. | ................. | 438/264 |
| 2009/0212345 A1 * | 8/2009 | Lee | ................................ | 257/321 |
| 2010/0213534 A1 | 8/2010 | Sekine et al. | | |
| 2011/0291175 A1 * | 12/2011 | Jee et al. | ........................ | 257/316 |

FOREIGN PATENT DOCUMENTS

| JP | 2004-247444 | 9/2004 |
|---|---|---|
| JP | 2009-289974 | 12/2009 |
| JP | 2010-103389 | 5/2010 |
| JP | 2010-219517 | 9/2010 |

* cited by examiner

*Primary Examiner* — Caridad Everhart
(74) *Attorney, Agent, or Firm* — Finnegan, Henderson, Farabow, Garrett & Dunner, L.L.P.

(57) ABSTRACT

In one embodiment, a method of manufacturing a semiconductor memory device is disclosed. The method can comprise forming a tunnel insulating film on a substrate, forming a charge storage layer including a conductor on the tunnel insulating film, forming an isolation trench which isolate the charge storage layer and the tunnel insulating film in the substrate, embedding an isolation insulating film in the isolation trench, removing a native oxide film which is formed on a surface of the charge storage layer, and forming an insulating film on a surface of the isolation insulating film and the surface of the charge storage layer. The process from the removing the native oxide film to the forming the insulating film carried out in a manufacture apparatus in which an oxygen concentration is controlled.

20 Claims, 5 Drawing Sheets

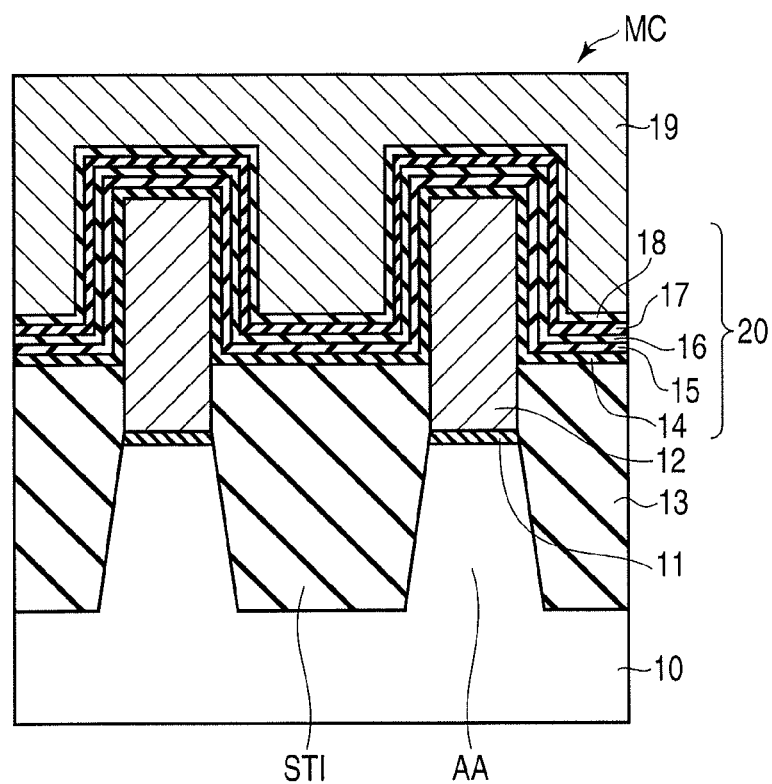
F I G. 1
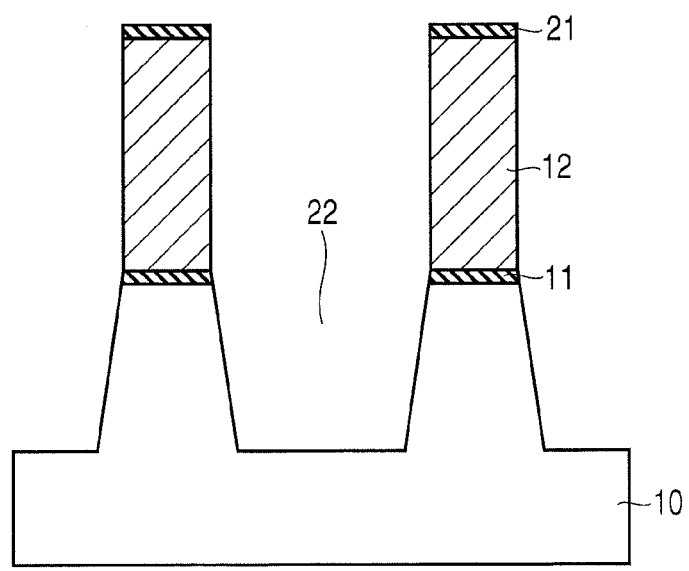
F I G. 2

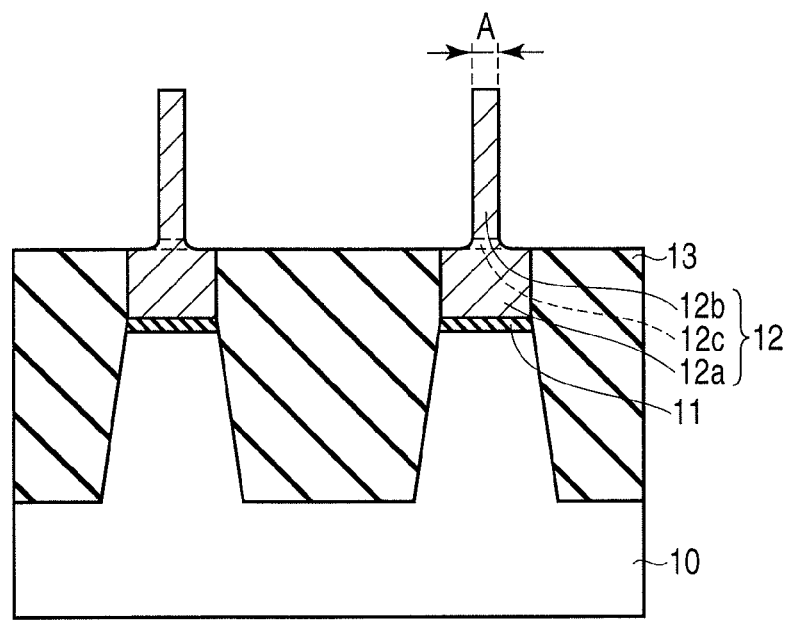
F I G. 9
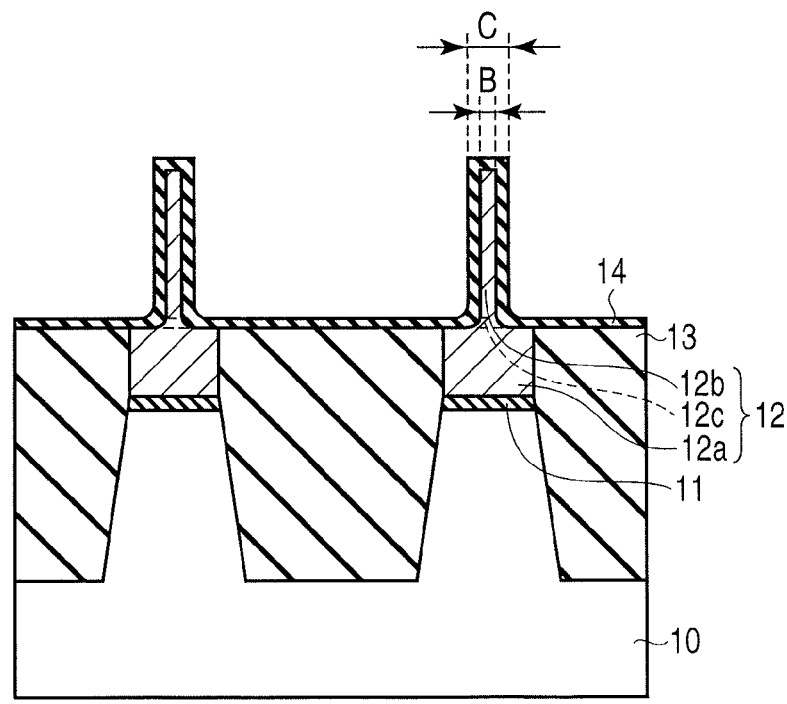
F I G. 10

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2010-211379, filed Sep. 21, 2010; the entire contents of which are incorporated herein by reference.

FIELD

Embodiments described herein relate generally to a semiconductor memory device and a method of manufacturing the same.

BACKGROUND

As nonvolatile semiconductor memory devices, a three-dimensional memory cell structure of a floating-gate electrode type and using side walls of a floating gate electrode as capacitance has been proposed. Memory cells of a floating-gate electrode type have an inter poly dielectric (IPD) and a control gate on a floating gate electrode.

In a process of manufacturing such memory cells, an upper part of the floating gate electrode is exposed by processing a shallow trench isolation (STI) structure and performing after-treatment by a chemical solution. In this processing, the floating gate electrode is exposed to the atmosphere, and thus oxygen adheres to the surface of the floating gate electrode, and an oxide film is formed on the surface.

The oxide film formed as described above has low capacity to resist pressure, and low insulation. In addition, since the oxide film is located in an interface between the floating gate electrode and the IPD, it can be an element which determines the writing characteristic of the device. Specifically, forming the IPD on the oxide film deteriorates the writing characteristic. More specifically, when a high electric field is applied in writing, a leakage current of the IPD increases, and decrease in the writing speed is caused.

BRIEF DESCRIPTION OF THE DRAWINGS

FIG. 1 is a cross-sectional view in a channel width direction of a structure of a semiconductor memory device according to a first embodiment.

FIG. 2 is a cross-sectional view in the channel width direction, illustrating a manufacturing step of the semiconductor memory device according to the first embodiment.

FIG. 9 is a cross-sectional view in the channel width direction illustrating a manufacturing step of the semiconductor memory device according to the second embodiment, which follows the step of FIG. 8.

FIG. 10 is a cross-sectional view in the channel width direction illustrating a manufacturing step of the semiconductor memory device according to the second embodiment, which follows the step of FIG. 9.

DETAILED DESCRIPTION

Figure 3:
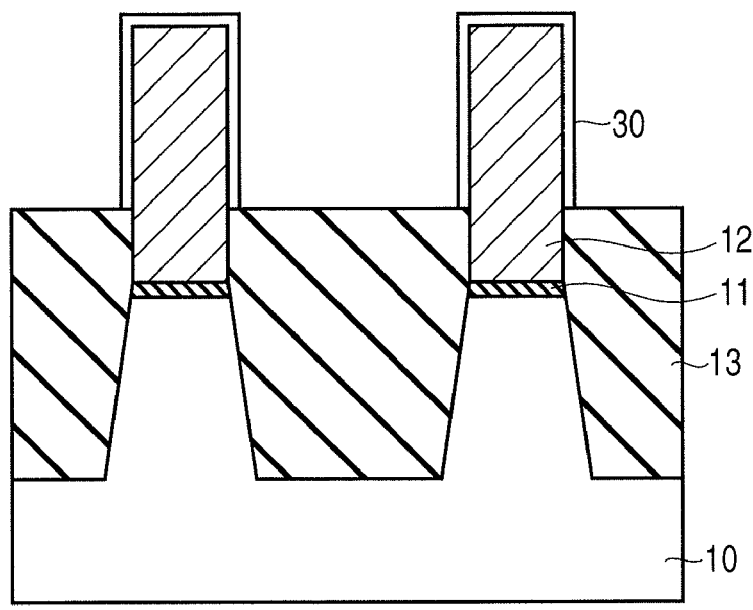
FIG. 3 is a cross-sectional view in the channel width direction illustrating a manufacturing step of the semiconductor memory device according to the first embodiment, which follows the step of FIG. 2.

In general, according to one embodiment, a method of manufacturing a semiconductor memory device is disclosed. The method can comprise forming a tunnel insulating film on a substrate; forming a charge storage layer including a conductor on the tunnel insulating film; forming an isolation trench which isolate the charge storage layer and the tunnel insulating film in the substrate by processing the charge storage layer, the tunnel insulating film, and the substrate; embedding an isolation insulating film in the isolation trench, such that an upper surface of the isolation insulating film is higher than a lower surface of the charge storage layer and lower than an upper surface of the charge storage layer; removing a native oxide film which is formed on a surface of the charge storage layer; and forming an insulating film on a surface of the isolation insulating film and the surface of the charge storage layer. The surface of the charge storage layer is not exposed to the atmosphere from the removing of the native oxide film to the forming of the insulating film.

Embodiments will be described hereinafter with reference to drawings. In the drawings, the same constituent elements are denoted by the same respective reference numbers.

First Embodiment

A semiconductor memory device according to the first embodiment will be explained with reference to FIG. 1 to FIG. 6. The first embodiment is an example of removing an oxide film which is formed on the surface of a floating gate electrode, and thereafter forming an IPD without exposing the floating gate electrode to the atmosphere.

[Structure]

The following is explanation of a structure of the semiconductor memory device according to the first embodiment, with reference to FIG. 1.

FIG. 1 is a cross-sectional view in a channel width direction of the semiconductor memory device according to the first embodiment.

As illustrated in FIG. 1, the semiconductor memory device according to the first embodiment comprises element areas (active area [AA]) in which a memory cell MC is formed and isolation areas, each of which is formed of an STI structure which separates the active areas in a substrate 10.

The substrate 10 is, for example, a silicon substrate. The substrate 10 has difference in level between the active areas and the isolation areas. More specifically, the substrate 10 has an upper level surface in the active areas AA, and a lower level surface in the isolation areas. Specifically, the substrate 10 has a trench in each isolation area.

The memory cell MC in the active areas comprises a tunnel insulating film 11 which is formed on the substrate 10, a floating gate electrode 12, an isolation insulating film 13, an inter poly dielectric (IPD) 20, and a control gate electrode 19.

More specifically, in each of the active areas, a tunnel insulating film 11 which is formed of, for example, a silicon oxide film is formed on the substrate 10. The electric capacity of the tunnel insulating film 11 is, for example, Ctnl. A floating gate electrode 12 which is formed of polysilicon or the like is formed on the tunnel insulating film 11. The floating gate electrode 12 functions as a charge storage layer.

On the other hand, in each of the isolation areas, an isolation insulating film 13 is formed in an isolation trench 22 (described later) in the substrate 10. The isolation insulating film 13 isolates the adjacent floating gate electrodes 12 from each other, and has an upper surface higher than the surface of the substrate 10 in the active areas. In addition, the upper surface of the isolation insulating film 13 is higher than a lower surface of the floating gate electrode 12, and lower than an upper surface of each floating gate electrode 12. In other words, side surfaces of a lower part (lower side surfaces) of each floating gate electrode 12 are covered with the isolation insulating film 13, and side surfaces of an upper part (upper side surfaces) thereof are exposed.

An IPD 20 is formed to cover the upper surface and the upper side surfaces of each floating gate electrode 12 and the upper surface of the isolation insulating film 13. The electric capacity of the IPD 20 is, for example, Cipd. The IPD 20 has a layered structure of, for example, NONON. Specifically, a silicon nitride film 14, a silicon oxide film 15, a silicon nitride film 16, a silicon oxide film 17, and a silicon nitride film 17 are formed in this order on the upper surface and the upper side surfaces of each floating gate electrode 12 and the upper surface of the isolation insulating film 13.

A control gate electrode 19 which serves as a word line is formed on the IPD 20.

A coupling ratio of the memory cell MC formed in the active area as described above is denoted by Cipd/(Ctnl+Cipd). In the memory cell MC, when high voltage is applied between the surface of the substrate 10 and the control gate electrode 19, a strong electric field is applied to the tunnel insulating film 11 in accordance with the coupling ratio. Thereby, a tunnel current flows between substrate 10 and the floating gate electrode 12 through the tunnel insulating film 11, and the accumulated charge quantity of the floating gate electrode 12 changes. Data writing operation and erasing operation of each memory cell MC are performed like this. Although not illustrated, memory cells MC are arranged in rows and columns along the channel width direction (word line direction) and the channel length direction (bit line direction).

[Manufacturing Method]

The following is explanation of a manufacturing method of the semiconductor memory device according to the first embodiment, with reference to FIG. 2 to FIG. 5.

FIG. 2 to FIG. 5 illustrate cross-sectional views in the channel width direction of the manufacturing process of the semiconductor memory device according to the first embodiment.

First, as illustrated in FIG. 2, a tunnel insulating film 11 formed of a silicon oxide film or the like is formed on the substrate 10. As a method of forming the tunnel insulating film 11, for example, chemical vapor deposition (CVD), atomic layer deposition (ALD), or thermal oxidation is used. A floating gate electrode (charge storage layer) 12 formed of, for example, polysilicon is formed on the tunnel insulating film 11. For example, CVD or ALD is used as a method of forming the floating gate electrode 12. Thereafter, a mask material 21 is formed on the floating gate electrode 12.

Next, a resist pattern (not shown) is formed on the mask material 21. Based on the resist pattern, the mask material 21, the floating gate electrode 12, and the tunnel insulating film 11 are successively processed, and the surface of the substrate 10 is exposed. For example, reactive ion etching (RIE) is used as a method of processing them. In addition, a width in the channel width direction of the floating gate electrode 12 is changed to about 10 to 40 nm by processing. Thereafter, the exposed surface of the substrate 10 is etched and further dug down, and thereby an isolation trench 22 is formed.

Next, as illustrated in FIG. 3, an isolation insulating film 13 is embedded in the isolation trench 22. More specifically, first, the isolation insulating film 13 formed of, for example, a silicon oxide film is formed on the whole surface of the substrate 10 until it reaches a height which covers the surface of the mask material 21, while it fills the inside of the isolation trench 22. For example, CVD is used as a method of forming the isolation insulating film 13. Next, the isolation insulating film 13 is polished by chemical mechanical polishing (CMP), and the mask material 21 is exposed. Thereby, the isolation insulating film 13 is embedded in the isolation trench 22, and the surface of the mask material 21 and the surface of the isolation insulating film 13 are flattened.

Next, the exposed mask material 21 is selectively removed by a predetermined chemical solution, and the surface of the floating gate electrode 12 is exposed. Then, the isolation insulating film 13 embedded in the isolation trench 22 is etched and dug down by using a dilute hydrofluoric acid solution. Thereby, side surfaces of the floating gate electrode 12 are exposed. In this processing, the isolation insulating film 13 is etched such that the upper surface of the isolation insulating film 13 is lower than the upper surface of the floating gate electrode 12 and higher than the lower surface of the floating gate electrode 12. Specifically, the upper surface and the upper side surfaces of the floating gate electrode 12 are exposed, and the lower side surfaces thereof are covered with the isolation insulating film 13.

In this processing, a chemical solution is used as aftertreatment of processing of the isolation insulating film 13 and pretreatment of the IPD 20 described later. Specifically, it is necessary to move the substrate 10 between apparatuses, and the exposed surface of the floating gate electrode 12 is exposed to the atmosphere. Thereby, oxygen adheres to the surface of the floating gate electrode 12, and a native oxide film 30 is formed. The native oxide film 30 described like this has low capacity to resist pressure and low insulation. Therefore, when IPD 20 is formed on the native oxide film 30, the writing characteristic of the memory cell MC deteriorates.

In comparison with this, in the present embodiment, the native oxide film 30 is removed before formation of IPD 20, and thereafter IPD 20 is formed without exposure to the atmosphere. The following is explanation of these steps.

Figure 4:
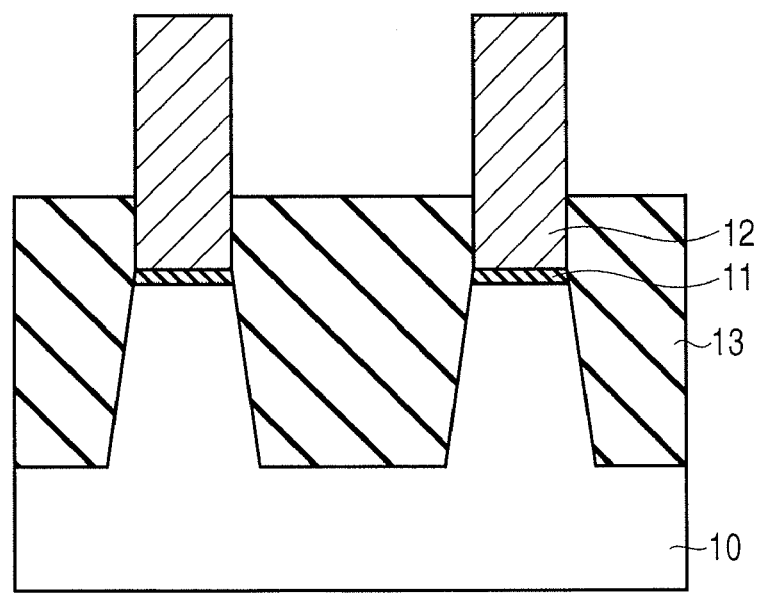
FIG. 4 is a cross-sectional view in the channel width direction illustrating a manufacturing step of the semiconductor memory device according to the first embodiment, which follows the step of FIG. 3.

First, as illustrated in FIG. 4, the native oxide film 30 which is formed on the surface of the floating gate electrode 12 is removed by dry cleaning technique. The dry cleaning technique can adopt a selection ratio of the floating gate electrode (polysilicon) 12 and the native oxide film (silicon oxide film) 30. More specifically, for example, ammonium fluoride is formed by reacting nitrogen trifluoride with ammonia, and introduced into a furnace. The ammonium fluoride reacts with the silicon native oxide film 30, and forms solid ammonium hexafluorosilicate. Thereafter, ammonium hexafluorosilicate is evaporated by thermal treatment of, for example, 100° C. or more. Thereby, the native oxide film 30 is removed, and the floating gate electrode 12 is exposed. Note that the ammonium fluoride is not limited to be formed by the abovementioned reaction. For example, the ammonium fluoride may be also formed by reacting nitrogen trifluoride with hydrogen.

Figure 5:
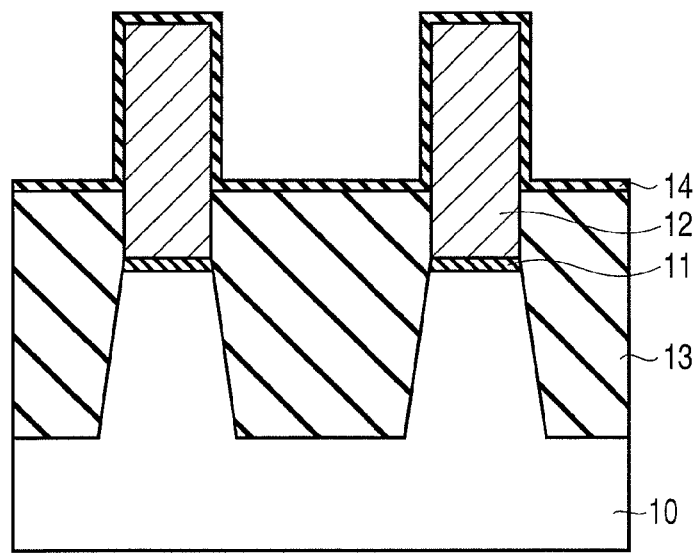
FIG. 5 is a cross-sectional view in the channel width direction illustrating a manufacturing step of the semiconductor memory device according to the first embodiment, which follows the step of FIG. 4.

Next, as illustrated in FIG. 5, a silicon nitride film 14 which serves as a part of IPD 20 is formed on the surfaces of the floating gate electrode 12 and the isolation insulating film 13. More specifically, for example, nitrogen radicals are produced by, for example, generating microwaves in an atmosphere including nitrogen gas. The surfaces of the floating gate electrode 12 and the isolation insulating film 13 are nitrided by using the nitrogen radicals. In this processing, for example, the intensity of the microwaves is 100 to 3000 W, the processing pressure is 5 to 30 Pa, and the substrate temperature is 350 to 900° C. The thickness of the silicon nitride film 14 is, for example, about 1 to 5 nm.

In this processing, it is unnecessary to perform chemical solution treatment between the dry cleaning, which is the step of removing the native oxide film 30, and nitriding which is the step of forming the silicon nitride film 14. Specifically, these steps can be continuously performed in the same furnace, and the floating gate electrode 12 is not exposed to the atmosphere in any of the steps. The IPD 20 which includes the silicon nitride film 14 formed by the above processing can improve the writing characteristic of the memory cell MC. The details of the characteristic of the IPD 20 will be explained layer.

Next, as illustrated in FIG. 1, a silicon oxide film 15, a silicon nitride film 16, and a silicon oxide film 17 (ONO) are formed in this order on the silicon nitride film 14. For example, low-pressure chemical vapor deposition (LPCVD) is used as a method of forming each of these films. The thickness of each of the silicon oxide film 15, the silicon nitride film 16, and the silicon oxide film 17 is, for example, about 1 to 5 nm. Thereafter, a silicon nitride film 18 is formed on the silicon oxide film 17. The thickness of the silicon nitride film 18 is about 1 to 5 nm. Thereby, IPD 20 which is formed of five insulating films of NONON is formed. Then, a control gate electrode 19 which serves as a word line is formed on the IPD 20.

Figure 6:
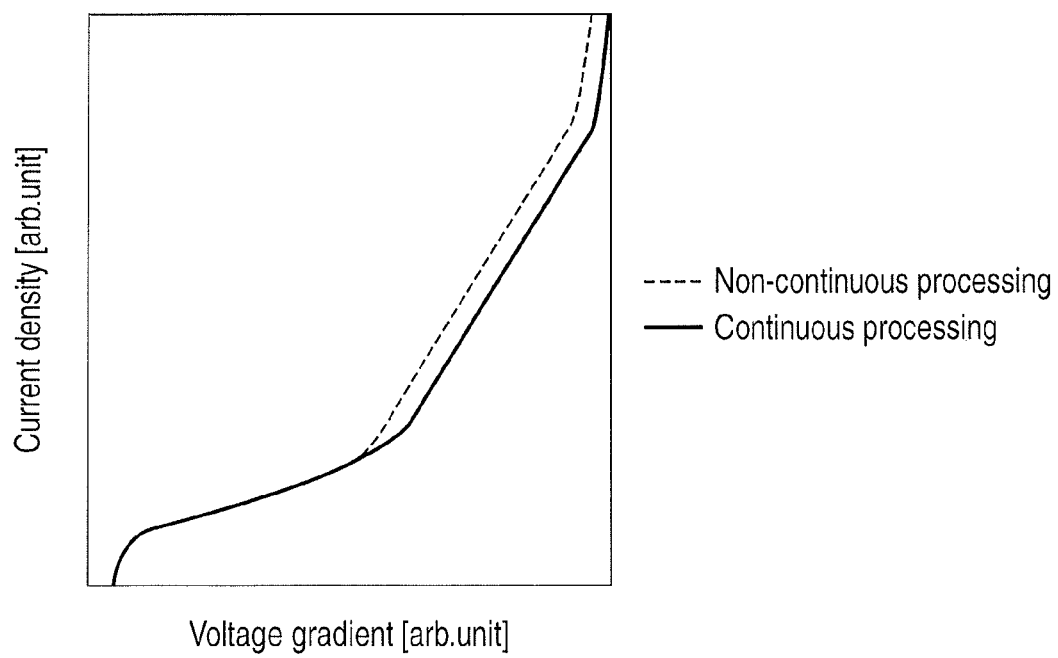
FIG. 6 is a graph illustrating an insulation characteristic of an IPD of the semiconductor memory device according to the first embodiment.

The following is explanation of the characteristic of the IPD 20 according to the present embodiment. As described above, the silicon nitride film 14 of the IPD 20 according to the present embodiment is an insulating film which is continuously formed in the same furnace without being exposed to the atmosphere. FIG. 6 illustrates an insulating characteristic of the IPD 20 according to the present embodiment.

As illustrated in FIG. 6, the relation between the voltage density (V/cm) and the current density (A/cm$^2$) shows that the IPD 20 (solid line) which includes the silicon nitride film 14 that is formed by continuous processing (without being exposed to the atmosphere) has insulation higher than that of an IPD (broken line) which includes a silicon nitride film that is formed by non-continuous processing (exposed to the atmosphere).

This is because the silicon nitride film 14 is a high-dielectric insulating film which has a very small quantity of adhering oxygen in the interface with the floating gate electrode 12. Specifically, since a high-dielectric silicon nitride film 14 is formed, it is considered that its barrier property against electrons in application of a high electric field is increased, and the possibility that electrons transmit through the insulating film is decreased. Like this, the interface between the floating gate electrode 12 and the IPD 20 is an element which determines the writing characteristic of the device. Increasing the insulation of the interface can reduce a leakage current of the IPD 20 even when high voltage is applied to the device in writing.

The layered structure of the IPD 20 is not limited to NONON. Other examples of the layered structure of the IPD 20 are ONO, NONO, ONON, NON, NO, and ON. Specifically, the innermost layer (the layer which is located in the interface with the floating gate electrode 12) of the IPD 20 is not limited to the silicon nitride film 14, but may be a silicon oxide film. In the case of adopting a silicon oxide film, the silicon oxide film is formed after the native oxide film 30 is removed, without exposure to the atmosphere, in the same manner as the silicon nitride film 14. The silicon oxide film formed as described above has a capacity to resist pressure and insulation which are higher than those of the native oxide film 30 which is naturally formed by exposure to the atmosphere.

[Effect]

According to the first embodiment, the manufacturing process of the semiconductor memory device is performed without exposing the surface of the floating gate electrode 12 to the atmosphere, from the step of removing the native oxide film 30 which is naturally formed on the surface of the floating gate electrode 12 to the step of forming the silicon nitride film 14 which is a part of the IPD 20. Thereby, it is possible to form a high-dielectric silicon nitride film 14 which has a small oxygen quantity on the electron-injecting side (the interface side between the IPD 20 and the floating gate electrode 12) of the IPD 20. Therefore, it is possible to reduce a leakage current when a high electric field is applied in writing. As a result, it is possible to increase the quantity of electrons which are injected into the floating gate electrode 12 in writing, and further increase the writing threshold of the memory cell MC.

In the present embodiment, the process from the step of removing the native oxide film 30 to the step of forming the silicon nitride film 14 which is a part of the IPD 20 is carried out in one furnace (a batch furnace) so that the surface of the floating gate electrode 12 is not exposed to the atmosphere during the process. However, using the same furnace throughout the process is not the only way of manufacturing a semiconductor memory device without exposing the surface of the floating gate electrode 12 to the atmosphere. Any manufacture apparatus can be used as long as it can control an oxygen concentration at a certain level that the native oxide film 30 is not formed on the surface of the floating gate electrode 12 throughout the process.

For example, cluster tools may be used as a manufacture apparatus. A cluster tool comprises a plurality of chambers, such as etching chambers and film forming chambers, and transportation parts between those chambers. Each chamber is a single wafer chamber (single wafer furnace, for example). Cluster tools can control the oxygen concentration within the entire apparatus including the chambers and the transportation parts between the chambers to a level low enough to prevent the native oxygen film 30. In other words, an IPD 20 which has a higher capacity to resist pressure and higher insulation can be formed using more than one chamber, as long as the chambers are in the same cluster tool.

Second Embodiment

A semiconductor memory device according to a second embodiment will be explained hereinafter with reference to FIG. 7 to FIG. 10. The second embodiment is an example in which a surface layer of a floating gate electrode is oxidized and made thinner before an oxide film which is naturally formed on a surface of the floating gate electrode is removed, and thereafter an IPD is formed without exposure to the atmosphere. In the second embodiment, the same points as those in the first embodiment are not explained, and only different points are explained.

[Structure]

Figure 7:
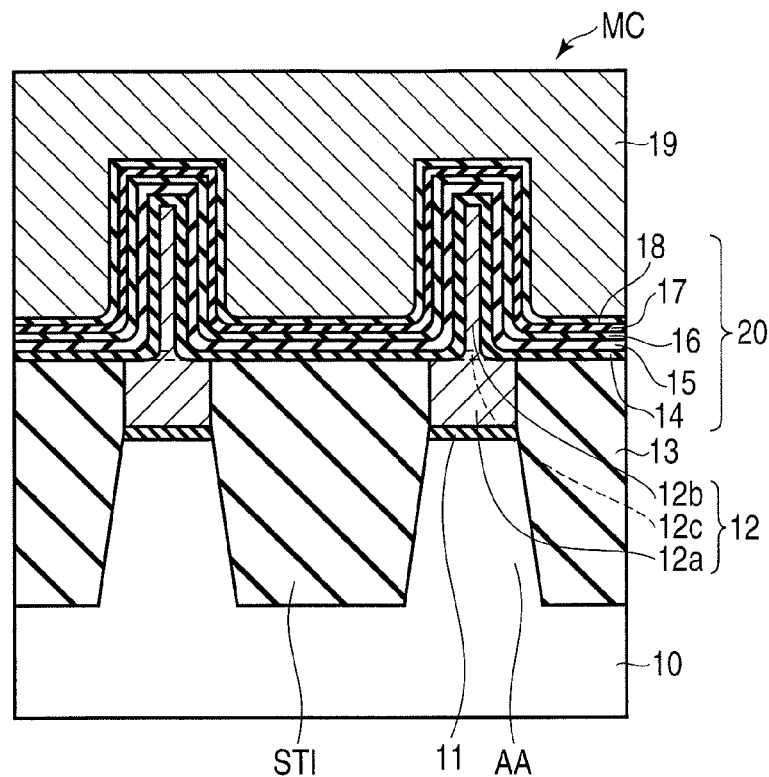
FIG. 7 is a cross-sectional view in a channel width direction of a structure of a semiconductor memory device according to a second embodiment.

The following is explanation of a structure of a semiconductor memory device according to the second embodiment, with reference to FIG. 7.

FIG. 7 is a cross-sectional view in a channel width direction of the semiconductor memory device according to the second embodiment.

As illustrated in FIG. 7, the semiconductor memory device according to the second embodiment is different from the first embodiment in that an upper part of a floating gate electrode 12 is made thinner. More specifically, in each active area, a tunnel insulating film 11 is formed on a substrate 10, and a floating gate electrode 12 is formed on the tunnel insulating film 11. The floating gate electrode 12 has a first part 12a which is a lower part, a second part 12b which is an upper part, and a connecting part 12c which connects the first part 12a and the second part 12b.

The first part 12a in the floating gate electrode 12 is formed on the tunnel insulating film 11, and has a first width in the channel width direction. An upper surface of the first part 12a has the same level as that of an upper surface of an isolation insulating film 13.

The second part 12b in the floating gate electrode 12 is formed above the first part 12a, and has a second width in the channel width direction, which is less than the first width. In addition, the second part 12b projects from the upper surface of the isolation insulating film 13, and is located in almost the center of the first part in the channel width direction. Specifically, the second part 12b is formed by making thinner a part of the floating gate electrode 12 from the first width to the second width, during a manufacturing process thereof described later.

The connecting part 12c in the floating gate electrode 12 is located between the first part 12a and the second part 12b, and connects them. In addition, the connecting part 12c is continuously and curvedly changed from the first width to the second width in the channel width direction, from the side of the first part 12a (lower side) toward the side of the second part 12b (upper side). More specifically, the connecting part 12c has a curved surface, and an angle between a tangent for the curved surface according to the level (height) and the surface of the substrate 10 simply increases from the lower part toward the upper part of the curved surface. The angle changes in a range of 0 to 90°. For example, an angle between a tangent of the curved surface in the lowermost part of the connecting part 12c and the surface of the substrate 10 is 0°, and an angle between a tangent of the curved surface in the uppermost part of the connecting part 12c and the surface of the substrate 10 is 90°.

An IPD 20 is formed to cover an upper surface and upper side surfaces of the floating gate electrode 12 and the upper surface of the isolation insulating film 13. A part of the IPD 20 which is formed on the connecting part 12c has a curved surface in the same manner as the connecting part 12c. A control gate electrode 19 which serves as a word line is formed on the IPD 20.

[Manufacturing Method]

A manufacturing method of the semiconductor memory device according to the second embodiment will be explained hereinafter with reference to FIG. 8 to FIG. 10. The manufacturing method of the semiconductor memory device according to the second embodiment is an example of realizing miniaturization by oxidizing and making thinner the surface of the floating gate electrode 12.

Figure 8:
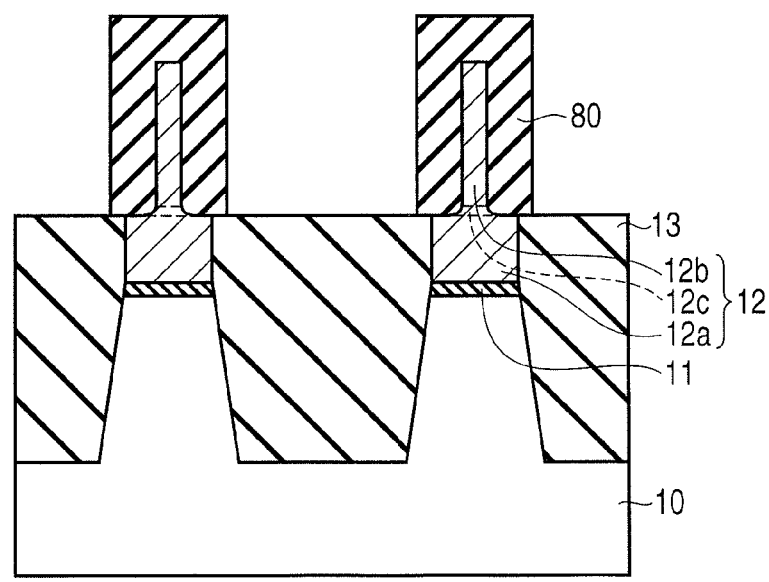
FIG. 8 is a cross-sectional view in the channel width direction illustrating a manufacturing step of the semiconductor memory device according to the second embodiment.

FIG. 8 to FIG. 10 are cross-sectional views in the channel width direction of the manufacturing process of the semiconductor memory device according to the second embodiment.

First, the manufacturing method is performed until the steps illustrated in FIG. 3 in the first embodiment. More specifically, the isolation insulating film 13 embedded in the isolation trench 22 is etched and dug down. Thereby, side surfaces of the floating gate electrode 12 are exposed. In this processing, as described above, oxygen adheres to the surface of the floating gate electrode 12 by exposure to the atmosphere, and a native oxide film 30 is formed. The width in the channel width direction of the floating gate electrode 12 is, for example, about 10 to 40 nm.

Next, as illustrated in FIG. 8, a silicon oxide film 80 is formed on the surface of the floating gate electrode 12. More specifically, oxygen radicals and oxygen ions are produced by, for example, generating microwaves in an atmosphere containing oxygen gas. The surface layer of the floating gate electrode 12 is oxidized by using the oxygen radicals and the oxygen ions. In this processing, for example, the microwave intensity is 500 to 5000 W, the processing pressure is 20 to 800 Pa, and the substrate temperature is a temperature from room temperature to 800° C. In addition, a bias of 0.1 to 300 mW/cm may be applied to draw the ions into the substrate direction.

Thereby, the surface layer of the floating gate electrode 12 is oxidized, the width in the channel width direction of the upper part of the floating gate electrode 12 is reduced to (slimmed), for example, about 5 to 20 nm, and a silicon oxide film 80 having a thickness of, for example, about 1 to 20 nm is formed on the surface of the upper part of the floating gate electrode 12. Specifically, the first part 12a, the second part 12b which has a width narrower than that of the first part 12a, and the connecting part 12c which connects them are formed in the floating gate electrode 12. In addition, since the surface layer of the in the floating gate electrode 12 is isotropically oxidized, an area in which the connecting part 12c is formed in oxidized in a curved form.

To increase the film formation rate of the silicon oxide film 80, it is possible to adopt a method of oxidizing the surface layer of the in the floating gate electrode 12 by an oxidant produced by reacting hydrogen gas with oxygen gas. In this case, it is possible to perform processing by setting the hydrogen gas flow ratio to 0.01 to 30% of the oxygen-hydrogen gaseous mixture. The oxidation method is not limited to these methods. For example, a method of using oxygen, ozone, water, or active oxygen as oxidant may be used.

Next, as illustrated in FIG. 9, the silicon oxide film 80 formed on the surface of the floating gate electrode 12 (the second part 12b and the connecting part 12c) is removed by dry cleaning technique. In this processing, the native oxide film 30 is simultaneously removed. More specifically, for example, ammonium fluoride is formed by reacting nitrogen trifluoride with ammonia, and introduced into the furnace. The ammonium fluoride reacts with the native oxide film 30, and forms solid ammonium hexafluorosilicate. Thereafter, ammonium hexafluorosilicate is evaporated by thermal treatment of, for example, 100° C. or more.

Thereby, the thin floating gate electrode 12 (the second part 12b and the connecting part 12c) is exposed. In this state, the second part 12b has a width A (for example, about 5 to 20 nm) in the channel width direction, and a height of about 20 to 200 nm. Width A is a cell width which does not cause collapse of the cell.

Next, as illustrated in FIG. 10, a silicon nitride film 14 which forms a part of an IPD 20 is formed on the surfaces of the floating gate electrode 12 (the second part 12b and the connecting part 12c) and the isolation insulating film 13. More specifically, for example, nitrogen radicals are produced by generating microwaves in an atmosphere containing nitrogen gas. The surface layers of the floating gate electrode 12 and the isolation insulating film 13 are nitrided by using the nitrogen radicals.

In this processing, the surface layers of the floating gate electrode 12 (the second part 12b and the connecting part 12c) and the isolation insulating film 13 are nitride, and thereby the width in the channel width direction of the second part 12b is further reduced, and a silicon nitride film 14 having a width of about 1 to 5 nm or the like is formed on the surface of the second part 12b.

Specifically, the second part 12b has a width B (for example, about 3 to 10 nm) which is less than width A in the channel width direction. Simultaneously, the silicon nitride film 14 which serves as a part of the IPD 20 is formed on the surface of the second part 12b. Therefore, it is possible to maintain a width C (for example, about 5 to 20 nm) which is greater than width A, by the second part 12b and the silicon nitride film 14 formed on the side surfaces of the second part 12b. Although width B is a cell width which may cause collapse of the cell, width C is a cell width which does not cause collapse of the cell.

Next, as illustrated in FIG. 7, a silicon oxide film 15, a silicon nitride film 16, and a silicon oxide film 17 (ONO) are formed in this order on the silicon nitride film 14, and thereafter a silicon nitride film 18 is formed on the silicon oxide film 17. In addition, a control gate electrode 19 which serves as a word line is formed on the IPD 20.

[Effect]

According to the above second embodiment, it is possible to obtain the same effect as that of the first embodiment.

In addition, in the second embodiment, the surface layer of the floating gate electrode 12 is oxidized and thereby a silicon oxide film 80 is formed, before the native oxide film 30 formed on the surface of the floating gate electrode 12 is removed. Thereafter, the native oxide film 30 is removed together with the silicon oxide film 80, and thereby the floating gate electrode 12 is made thinner. Thereby, it is possible to miniaturize the memory cell MC.

Reducing the thickness of the IPD 20 is limited in view of the writing characteristic. Therefore, to achieve miniaturization of the memory cell MC, it is necessary to reduce the size (the width in the channel width direction) of the floating gate electrode 12. However, when the size of the floating gate electrode 12 is reduced to a predetermined size or more, the floating gate electrode 12 collapses during the manufacturing process, by after-treatment using a chemical solution after processing of the floating gate electrode 12, and pretreatment using a chemical solution before formation of the IPD 20.

In comparison with this, according to the present embodiment, the silicon nitride film 14 is formed on the surface of the floating gate electrode 12 simultaneously with the step of reducing the width of the upper part of the floating gate electrode 12 to width B which may cause collapse. Thereby, the total size of the floating gate electrode 12 and the silicon nitride film 14 is maintained at a size of width C (or width A) or more, which does not cause collapse, during the manufacturing process. Specifically, according to the present embodiment, it is possible to prevent collapse of the cell during the manufacturing process, while miniaturization of the memory cell MC is achieved.

In addition, according to the present embodiment, it is unnecessary to perform any treatment by a chemical solution between dry cleaning, which is the step of removing the silicon oxide film 80, and the nitriding which is the step of forming the silicon nitride film 14. Therefore, it is possible to prevent collapse of the cell more securely.

Besides, in the present embodiment, the surface of the connecting part 12c in the floating gate electrode 12 has a curved shape. This structure suppresses electric field concentration caused by corner parts of the floating gate electrode 12 and the control gate electrode 19. Consequently, a leakage current produced when a high electric field is applied in writing can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising:
    forming a tunnel insulating film on a substrate;
    forming a charge storage layer including a conductor on the tunnel insulating film;
    forming an isolation trench which isolate the charge storage layer and the tunnel insulating film in the substrate by processing the charge storage layer, the tunnel insulating film, and the substrate;
    embedding an isolation insulating film in the isolation trench, such that an upper surface of the isolation insulating film is higher than a lower surface of the charge storage layer and lower than an upper surface of the charge storage layer;
    removing a native oxide film which is formed on a surface of the charge storage layer; and
    forming an insulating film on a surface of the isolation insulating film and the surface of the charge storage layer,
    wherein the process from the removing the native oxide film to the forming the insulating film carried out in a manufacture apparatus in which an oxygen concentration is controlled.

2. The method of claim 1, wherein
    the removing of the native oxide film is performed by dry cleaning, and
    the forming of the insulating film is performed by nitriding surface layers of the isolation insulating film and the charge storage layer.

3. The method of claim 2, wherein the charge storage layer is polysilicon, and the insulating film is a silicon nitride film.

4. The method of claim 2, wherein the dry cleaning is performed by using ammonium fluoride, and thereafter performing thermal treatment at 100° C. or more.

5. The method of claim 2, wherein the nitriding is performed by using nitrogen radicals.

6. The method of claim 2, wherein both the dry cleaning and the nitriding are performed in the same furnace or in the same cluster tool.

7. The method of claim 1, wherein
    the removing the native oxide film is performed by dry cleaning, and
    the forming the insulating film is performed by forming an oxide film the surface of the isolation insulating film and the charge storage layer.

8. The method of claim 7, wherein the charge storage layer is polysilicon, and the insulating film is a silicon oxide film.

9. The method of claim 1, further comprising:
before the forming of the insulating film,
forming an oxide film on the surface of the charge storage layer by oxidizing a surface layer of an upper part of the charge storage layer, which is located upper than the upper surface of the isolation insulating film; and
reducing a width of the upper part of the charge storage layer, which is located upper than the upper surface of the isolation insulating film, in a channel width direction to a second width which is less than a first width of a lower part of the charge storage layer by removing the oxide film.

10. The method of claim 9, wherein
the removing of the native oxide film and the oxide film is performed by dry cleaning, and
the forming of the insulating film is performed by nitriding surface layers of the isolation insulating film and the charge storage layer.

11. The method of claim 10, wherein by the nitriding, the width of the upper part of the charge storage layer, which is located upper than the upper surface of the isolation insulating film, in the channel width direction is reduced to a third width which is less than the second width, and a total width of the upper part of the charge storage layer and the insulating film which is formed on a surface of the upper part is set to a fourth width which is greater than the second width.

12. The method of claim 9, wherein the oxidizing is performed by using oxygen radicals and oxygen ions.

13. The method of claim 9, wherein the oxidizing is performed by using an oxidant which is produced by reacting hydrogen gas with oxygen gas.

14. The method of claim 13, wherein a flow ratio of the hydrogen gas in a gaseous mixture of the hydrogen gas and the oxygen gas is 0.01 to 30 percent.

15. The method of claim 9, wherein the oxidizing is performed by using one of the ozone, water, and active oxygen.

16. A semiconductor memory device comprising:
a substrate;
isolation insulating films which are embedded in isolation trenches formed in the substrate, and each of which has an upper surface higher than a surface of the substrate; and
a memory cell which is located between the isolation insulating films and formed on the substrate,
the memory cell including:
a tunnel insulating film which is formed on the substrate;
a charge storage layer which is formed on the tunnel insulating film and formed of a conductor;
an inter poly dielectric which is formed on the charge storage layer; and
a control gate electrode which is formed on the inter poly dielectric,
the charge storage layer including:
a first part which is formed on the tunnel insulating film, and has an upper surface that is equal in level to the upper surfaces of the isolation insulating films, and a first width in a channel width direction;
a second part which is formed above the first part, and has a second width that is less than the first width in the channel width direction; and
a connecting part which connects the first part with the second part,
wherein a width in the channel width direction of the connecting part continuously changes from the first width to the second width from a side facing the first part toward a side facing the second part.

17. The semiconductor memory device of claim 16, wherein the width in the channel width direction of the connecting part curvedly changes from the first width to the second width from the side facing the first part toward the side facing the second part.

18. The semiconductor memory device of claim 16, wherein the charge storage layer is polysilicon, and the insulating film is a silicon nitride film.

19. The semiconductor memory device of claim 16, wherein the charge storage layer is polysilicon, and the insulating film is a silicon oxide film.

20. The semiconductor memory device of claim 16, wherein the second part has a height of about 20 to 200 nm, the second width is about 3 to 10 nm, and the first width is about 10 to 40 nm.

* * * * *

UNITED STATES PATENT AND TRADEMARK OFFICE
CERTIFICATE OF CORRECTION

| | | |
|---|---|---|
| PATENT NO. | : 8,383,481 B2 | Page 1 of 1 |
| APPLICATION NO. | : 13/104815 | |
| DATED | : February 26, 2013 | |
| INVENTOR(S) | : Tanaka | |

It is certified that error appears in the above-identified patent and that said Letters Patent is hereby corrected as shown below:

Title Page, Item 57, in the Abstract, line 5, change "isolate" to --isolates--.

Title Page, Item 57, in the Abstract, line 13, change "carried" to --is carried--.

In the Claims

Claim 1, column 10, line 28, change "isolate" to --isolates--.

Claim 1, column 10, line 43, change "carried" to --is carried--.

Claim 1, column 10, line 66, change "the surface" to --on the surface--.

Signed and Sealed this
Twenty-eighth Day of May, 2013

Teresa Stanek Rea
*Acting Director of the United States Patent and Trademark Office*